United States Patent
Mazza et al.

(10) Patent No.: US 12,046,651 B2
(45) Date of Patent: Jul. 23, 2024

(54) LOGIC CELL LAYOUT DESIGN FOR HIGH DENSITY TRANSISTORS

(71) Applicant: GLOBALFOUNDRIES U.S. Inc., Malta, NY (US)

(72) Inventors: James P. Mazza, Saratoga Springs, NY (US); Elizabeth Strehlow, Malta, NY (US); Motoi Ichihashi, Sunnyvale, CA (US); Xuelian Zhu, San Jose, CA (US); Jia Zeng, Sunnyvale, CA (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 227 days.

(21) Appl. No.: 17/515,914

(22) Filed: Nov. 1, 2021

(65) Prior Publication Data

US 2023/0132912 A1    May 4, 2023

(51) Int. Cl.
*H01L 27/02* (2006.01)
*H01L 23/528* (2006.01)
*H01L 29/423* (2006.01)

(52) U.S. Cl.
CPC .... *H01L 29/42376* (2013.01); *H01L 23/5286* (2013.01)

(58) Field of Classification Search
CPC ............. H01L 29/42376; H01L 29/423; H01L 23/5286; H01L 23/528; H01L 27/0207
See application file for complete search history.

(56) References Cited

U.S. PATENT DOCUMENTS

| | | | |
|---|---|---|---|
| 6,838,713 B1 | 1/2005 | Gheewala et al. | |
| 8,698,205 B2 | 4/2014 | Tzeng et al. | |
| 9,373,624 B1* | 6/2016 | Balakrishnan | ............................... H01L 21/823821 |
| 10,121,882 B1* | 11/2018 | Ho | ....................... H01L 29/0847 |
| 10,290,653 B2 | 5/2019 | Chen et al. | |
| 10,832,971 B2* | 11/2020 | Venigalla | ......... H01L 21/823412 |
| 2014/0264924 A1* | 9/2014 | Yu | ........................ H01L 27/0207 438/622 |
| 2016/0225767 A1* | 8/2016 | Liu | ...................... H01L 27/0207 |
| 2019/0006388 A1* | 1/2019 | Agarwal | ............. H01L 27/0924 |

* cited by examiner

*Primary Examiner* — Walter H Swanson
*Assistant Examiner* — Jacob T Nelson
(74) *Attorney, Agent, or Firm* — David Cain; Andrew M. Calderon; Calderon Safran & Wright, PC

(57) ABSTRACT

The present disclosure relates to semiconductor structures and, more particularly, to a logic cell layout design for high density transistors and methods of manufacture. The structure includes a plurality of active gates in a high density transistor, and at least one dummy gate which is continuous and is adjacent to at least one active gate of the active gates in a multi-row cell of the high density transistor.

20 Claims, 3 Drawing Sheets

US 12,046,651 B2

LOGIC CELL LAYOUT DESIGN FOR HIGH DENSITY TRANSISTORS

FIELD OF THE INVENTION

The present disclosure relates to semiconductor structures and, more particularly, to a logic cell layout design for high density transistors and methods of manufacture.

BACKGROUND

In a block of logic, when single height cells abut multi-row high density cells of a high-density transistor, a gate cut under a power rail region extends into the multi-row high density cells. Therefore, manufacturing risks can occur in a transistor gate due to the gate cut extending through the multi-row high density cells. For example, if a high-density transistor cell is prepared and deployed in a chip design, a long cut layer is broken off in a middle area to connect a gate over cell rows. Due to a stress of a cut resist mask and etching, a transistor gate profile tends to be distorted. Therefore, manufacturing risks can occur in the high-density transistor at the left or right direction with respect to a multi-row standard cell.

SUMMARY

In an aspect of the disclosure, a structure includes a plurality of active gates in a high density transistor, and at least one dummy gate which is continuous and is adjacent to at least one active gate of the active gates in a multi-row cell of the high density transistor.

In an aspect of the disclosure, a logic cell layout includes at least one dummy gate in a multi-row cell of a high density transistor, at least one active gate adjacent to the at least one dummy gate, a plurality of remaining dummy gates which each include a power rail cut in the high density transistor, and a cut cancellation layer over the at least one dummy gate.

In an aspect of the disclosure, a method includes providing a cut cancellation layer on at least one dummy gate which is adjacent to at least one active gate in a multi-row cell of a high density transistor, and performing a plurality of power rail polysilicon cuts on remaining dummy gates of the high density transistor, and the cut cancellation layer prevents cutting of the at least one dummy gate such that the at least one dummy gate is continuous and devoid of any gate cut in the high density transistor.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
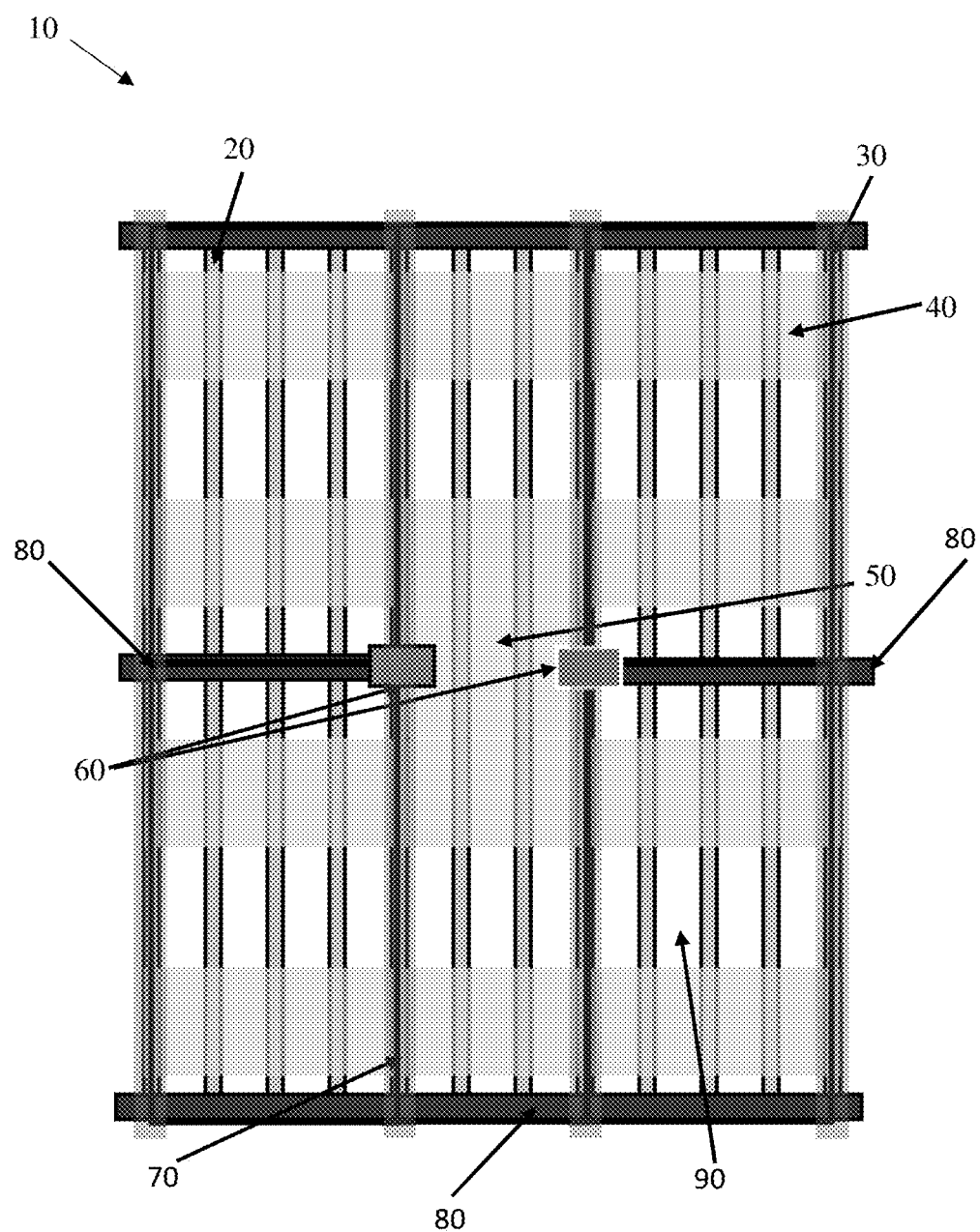
FIG. 1 shows a logic cell layout design in accordance with aspects of the present disclosure.

The present disclosure relates to semiconductor structures and, more particularly, to a logic cell layout design for high density transistors and methods of manufacture. In embodiments, a multi-row cell includes an active gate extending from one row to another, with a continuous dummy gate adjacent to active regions. Advantageously, manufacturing of a transistor gate (i.e., PC) is improved. In addition, a frequency improvement in a standard cell is achieved due to an increased fin count, no area bloat occurs since there is no dummy gate required, and the layout scheme is compatible with single height standard cells. As to the latter feature, compatibility with the single height standard cells is due to a rail to rail dummy gate at a boundary of the high-density transistor.

In known circuits, a multi-row height standard cell can be formed with a cut boundary transistor gate (i.e., PC) and/or inserting a dummy gate. In particular, it is possible to add a dummy gate in known circuits to support the creating of a transistor gate in a multi-row cell. However, when adding the dummy gate in the transistor gate in the multi-row cell of known circuits, manufacturing risks can occur due to lack of polysilicon (i.e., a cut dummy gate) at active regions of a cell boundary. In particular, in known circuits, dummy gates adjacent to active gates (i.e., active polysilicon gates) are cut by abutting a single height power rail polysilicon cut in a multi-row cell. Therefore, the dummy gates adjacent to active gates (i.e., active polysilicon gates) are non-continuous. The non-continuous dummy gates adjacent to active gates in known circuits may cause manufacturing risks including a physical deformation of the gate and device mismatches.

In contrast to known circuits, the present disclosure includes a continuous dummy gate adjacent to active regions in a multi-row cell. In particular, the present disclosure includes a multi-row height cell with a continuous boundary transistor gate (i.e., PC) with no additional dummy gates. Thus, in contrast to the known circuits, the present disclosure improves the gate profile of a high-density transistor and reduces manufacturing risks of the high-density transistor. In further embodiments, additional dummy gates may be included to the continuous dummy gate adjacent to the active regions in the multi-row cell.

The logic cell layout design for high density transistors of the present disclosure may be manufactured in a number of ways using a number of different tools. In general, though, the methodologies and tools are used to form structures with dimensions in the micrometer and nanometer scale. The methodologies, i.e., technologies, employed to manufacture the logic cell layout design for high density transistors of the present disclosure have been adopted from integrated circuit (IC) technology. For example, the structures are built on wafers and are realized in films of material patterned by photolithographic processes on the top of a wafer. In particular, the fabrication of the photonic chip security structure uses three basic building blocks: (i) deposition of thin films of material on a substrate, (ii) applying a patterned mask on top of the films by photolithographic imaging, and (iii) etching the films selectively to the mask.

FIG. 1 shows a logic cell layout design in accordance with aspects of the present disclosure. More specifically, the structure 10 includes active gates 20, dummy gates 30, an active region 40 (shown in light gray), a multi-row high density transistor 50, a cut cancellation layer 60, a cell outline 70, a power rail polysilicon cut 80, and a single height cell 90. In embodiments, the structure 10 may be formed in a silicon-on-insulator (SOI) substrate, a bulk wafer, or utilizing FinFet technologies. In an example, the structure may include a semiconductor-on-insulator (SOI) substrate composed of any suitable material including, but not limited to, Si, SiGe, SiGeC, SiC, GaAs, InAs, InP, and other III/V or II/VI compound semiconductors. Further, the single height cell 90 may be either a PFET transistor or a NFET transistor.

Still referring to FIG. 1, each of the active gates 20 may include a polysilicon gate which traverses in a vertical direction to extend across multiple cell rows. It should be understood by those of skill in the art, though, that the active gates 20 are not limited to a polysilicon gate. For example, the active gates 20 may be a metal gate. In embodiments, the active gates 20 may be fabricated using known first gate or replacement gate fabrication processes. In embodiments, each of the dummy gates 30 may have a same material as the active gates (e.g., polysilicon gates or metal gates) or a different material.

In FIG. 1, during a design stage and prior to masking, the cut cancellation layer 60 may be placed on the dummy gates 30 adjacent to the active gates 20 (i.e., active polysilicon gates) in the multi-row high density transistor 50 (i.e., at a boundary of an area-efficient boost (AEB) cell). The cut cancellation layer 60 may be a Boolean non-operation in the code during the design stage and prior to masking. In embodiments, the cut cancellation layer 60 may be used to remove the power rail polysilicon cut 80 on dummy gates 30 adjacent to the active gates 20 (i.e., active polysilicon gate) in the multi-row high density transistor 50. In an alternative embodiment, the cut cancellation layer 60 may be used for Boolean processing in a gate cut mask layer.

In the design stage and prior to masking, the power rail polysilicon cut 80 will cut the dummy gates 30 in the active gates 20 and the dummy gates 30 with the exception of the area of the cut cancellation layer 60. Therefore, by cutting the active gates 20 and the dummy gates 30 with the exception of the area of the cut cancellation layer 60, dummy gates 30 adjacent to the active gates 20 (i.e., active polysilicon gate) are continuous and devoid of any gate cut in the multi-row high density transistor 50. Accordingly, the dummy gates 30 which are continuous and devoid of any gate cut in the multi-row high density transistor 50 provide better gate support (i.e., better gate profile) and manufacturability.

In an alternative embodiment, designers may directly draw a dummy gate 30 which is continuous and adjacent to the active gates 20 of the multi-row high density transistor 50. In another embodiment, designers may use other Boolean processing methods to achieve a final design of the dummy gate 30 structure which is continuous and adjacent to the active gates 20 of the multi-row high density transistor 50.

Figure 2:
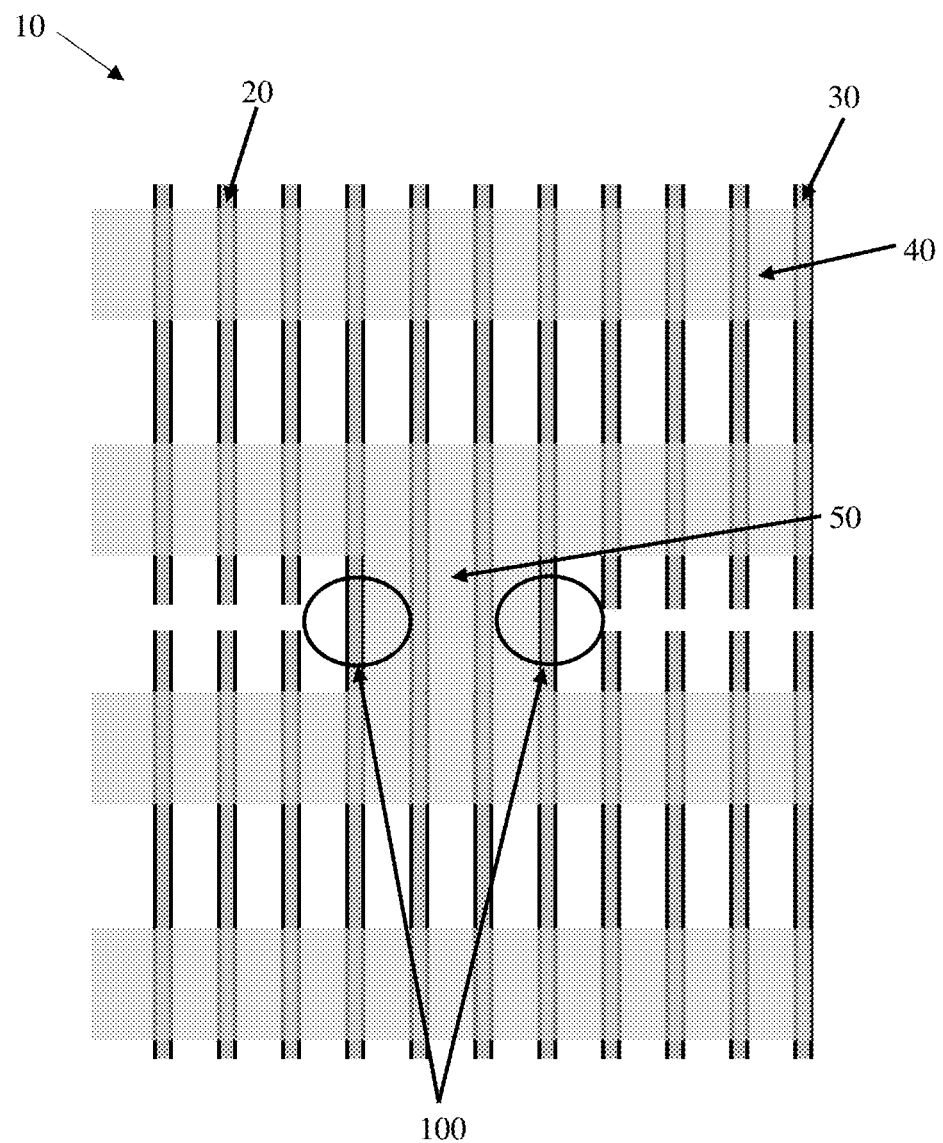
FIG. 2 shows a silicon level of the logic cell in accordance with aspects of the present disclosure.

FIG. 2 shows a silicon level of the logic cell in accordance with aspects of the present disclosure. In the silicon level of the structure 10 of FIG. 2, the dummy gates 30 adjacent to the active gates 20 (i.e., active polysilicon gate) may be continuous (i.e., not cut) in the multi-row high density transistor 50, as depicted by arrows at the continuous area 100. Each of these adjacent dummy gates 30 with the continuous area 100 may be different from the remaining dummy gates 30, which may include cuts (i.e., non-continuous area) due to the power rail polysilicon cut 80 at the design stage. Further, the power rail polysilicon cut 80 may be performed at the design stage before any masking or etching steps in the fabrication processes.

In alternative embodiments, a direct print gate structure fabrication process may allow the dummy gates 30 to include the continuous area 100 in the multi-row high density transistor 50. In the alternative embodiments, the dummy gates 30, which are continuous and devoid of any gate cut in the multi-row high density transistor 50, also provide improved gate support and manufacturability in comparison to known circuits.

Figure 3A:
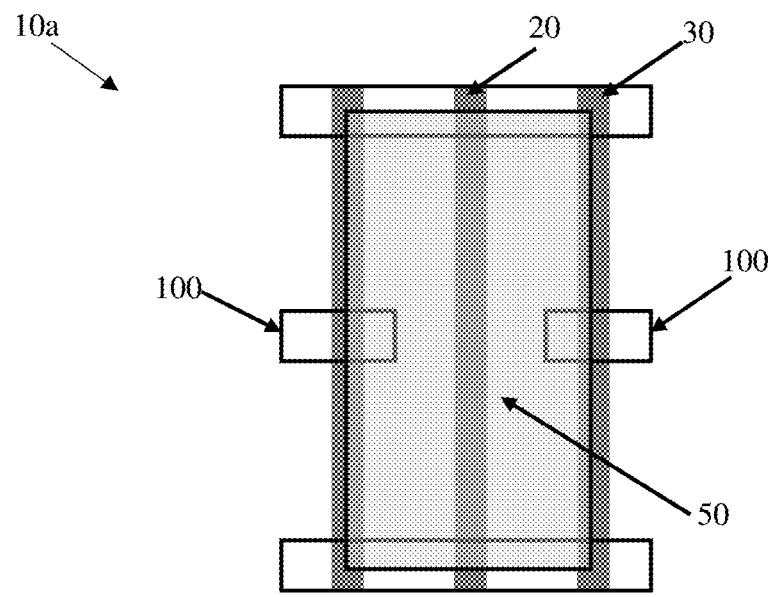
FIGS. 3A and 3B show another logic cell layout design in accordance with aspects of the present disclosure.
Figure 3B:
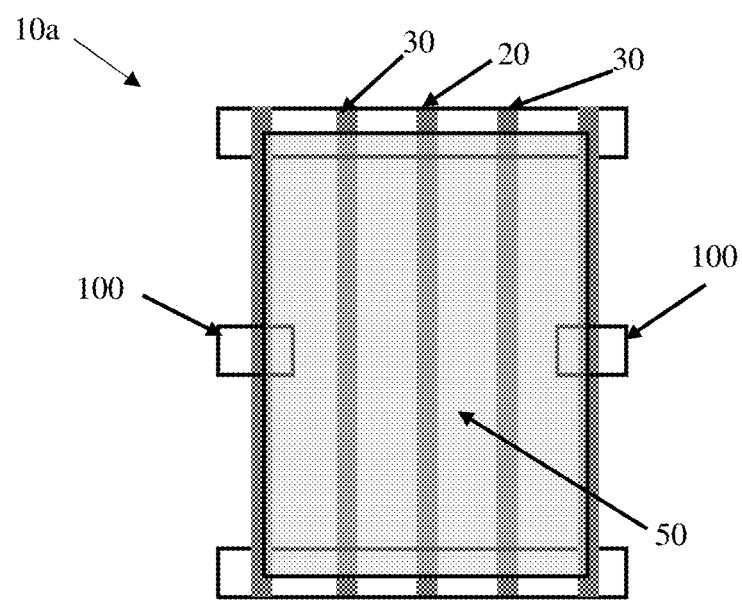

FIGS. 3A and 3B show another logic cell layout design in accordance with aspects of the present disclosure. In FIG. 3A, the structure 10a may be a dual-height cell for the multi-row high density transistor 50, which includes the active gates 20 (i.e., active polysilicon gate) and the dummy gates 30. In the structure 10a, the dummy gates 30 may include the continuous area 100 in the multi-row high density transistor 50.

In FIG. 3B, the structure 10a may include additional dummy gates 30. By including the additional dummy gates 30, a gate profile risk will be reduced, and manufacturability will be improved. Although FIG. 3B shows two additional dummy gates being included, one or more dummy gates 30 may be inserted in the area-efficient boost (AEB) cells. In comparison to FIG. 2, the embodiment of FIG. 3B may result in a larger cell size.

A logic cell layout design for high density transistors may be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips may be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either surface interconnections and buried interconnections or both surface interconnections and buried interconnections). In any case the chip is then integrated with other chips, discrete circuit elements, and/or other signal processing devices as part of either (a) an intermediate product, such as a motherboard, or (b) an end product. The end product may be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:
1. A structure comprising:
   a plurality of active gates in a logic cell layout design, wherein the active gates traverse in a vertical direction to extend across multiple cell height rows, each cell height being from power rail to power rail;

at least one dummy gate which is continuous and devoid of any gate cuts, the at least one dummy gate being adjacent to at least one active gate of the active gates in a multi-row height cell of the logic cell layout design, the at least one dummy gate is devoid of any gate cuts due to a cut cancellation layer;

the cut cancellation layer being utilized to remove a power rail polysilicon cut on the at least one dummy gate; and a plurality of remaining dummy gates which include a power rail cut in the logic cell layout design.

2. The structure of claim 1, wherein each of the plurality of active gates comprise an active polysilicon gate.

3. The structure of claim 1, wherein each of the plurality of active gates comprise an active metal gate.

4. The structure of claim 1, wherein each of the plurality of active gates comprise a replacement gate.

5. The structure of claim 1, wherein the at least one dummy gate is devoid of any gate cuts in a region adjacent to the at least one active gate of the logic cell layout design.

6. The structure of claim 1, further comprising additional dummy gates in the multi-row cell of the logic cell layout design.

7. The structure of claim 1, further comprising a plurality of remaining dummy gates which are non-continuous and include a gate cut and a power rail cut in the logic cell layout design.

8. The structure of claim 1, further comprising a single height cell adjacent to the logic cell layout design.

9. The structure of claim 8, wherein the single height cell comprises a PFET.

10. The structure of claim 8, wherein the single height cell comprises a NFET.

11. The structure of claim 1, wherein the active gates extend from one row to another row in the logic cell layout design.

12. A logic cell layout comprising:

at least one dummy gate in a multi-row cell of a logic cell layout design;

at least one active gate adjacent to the at least one dummy gate, wherein the at least one active gate traverses in a vertical direction to extend across multiple cell height rows, each cell height being from power rail to power rail;

a plurality of remaining dummy gates which each include a power rail cut in the logic cell layout design; and a cut cancellation layer over the at least one dummy gate to prevent cutting of the at least one dummy gate, wherein the at least one dummy gate is continuous and devoid of any gate cuts, the at least one dummy gate being adjacent to the at least one active gate in the logic cell layout design, and the cut cancellation layer is utilized to remove a power rail polysilicon cut on the at least one dummy gate.

13. The logic cell layout of claim 12, wherein the at least one dummy gate is continuous and devoid of any power rail cuts and the plurality of remaining dummy gates are non-continuous.

14. The logic cell layout of claim 12, wherein the at least one active gate comprises a plurality of active gates, the at least one dummy gate comprises a plurality of dummy gates, and the cut cancellation layer is placed on the plurality of dummy gates adjacent to the plurality of active gates.

15. The logic cell layout of claim 12, wherein the cut cancellation layer comprises a Boolean non-operation in code.

16. The logic cell layout of claim 12, further comprising a single height cell adjacent to the logic cell layout design.

17. The logic cell layout of claim 12, wherein the cut cancellation layer is used to remove the power rail cut on the at least one dummy gate adjacent to the at least one active gate in the logic cell layout design.

18. The logic cell layout of claim 16, further comprising a dual height cell within the logic cell layout design.

19. The logic cell layout of claim 16, wherein the power rail cut will cut the remaining dummy gates with the exception of an area of the cut cancellation layer over the at least one dummy gate.

20. A method comprising:

providing a cut cancellation layer on at least one dummy gate which is adjacent to at least one active gate in a multi-row cell of a logic cell layout design, wherein the active gate traverses in a vertical direction to extend across multiple cell height rows, each cell height being from power rail to power rail; and performing a plurality of power rail polysilicon cuts on remaining dummy gates of the logic cell layout design, wherein the cut cancellation layer prevents cutting of the at least one dummy gate such that the at least one dummy gate is continuous and devoid of any gate cut, the at least one dummy gate being adjacent to the at least one active gate in the logic cell layout design, wherein the cut cancellation layer is between layers of cut dummy gates, and the cut cancellation layer being utilized to remove another power rail polysilicon cut on the at least one dummy gate.

\* \* \* \* \*